United States Patent [19]

Lindquist et al.

[11] Patent Number: 5,041,883
[45] Date of Patent: Aug. 20, 1991

[54] LIGHT EMITTING DIODES WITH NITROGEN DOPING

[75] Inventors: Peter F. Lindquist, Sunnyvale; Michael J. Peanasky; Jacob C. L. Tarn, both of San Jose; Chin W. Tu, Cupertino, all of Calif.

[73] Assignee: Hewlett-Packard Company, Palo Alto, Calif.

[21] Appl. No.: 590,370

[22] Filed: Sep. 28, 1990

[51] Int. Cl.$^5$ ............................................. H01L 33/00
[52] U.S. Cl. ........................................ 357/17; 357/16; 357/63; 357/90; 357/45
[58] Field of Search .................... 357/17, 16, 90, 45, 357/63

[56] References Cited

U.S. PATENT DOCUMENTS

| | | | |
|---|---|---|---|
| 3,931,631 | 1/1976 | Groves et al. | 357/17 |
| 3,984,263 | 10/1976 | Asao et al. | 357/17 |
| 4,154,630 | 5/1979 | Diguet et al. | 357/63 X |
| 4,942,439 | 7/1990 | Schairer | 357/17 |

OTHER PUBLICATIONS

Blakeslee et al., "Reducing Resistance in PN Junctions Using GaAs$_{i-x}$P$_x$", IBM Technical Disclosure Bulletin, vol. 15, No. 4, Sep. 1972, p. 1284.
Kirby, "Dislocation Pinning in GaAs by the Deliberate Introduction of Impurities", IEEE Journal of Quantum Electronics, vol. QE-11, No. 7, Jul. 1975, pp. 562-568.
Westphalen, R. et al., "Epilayers with Extremely Low Dislocation Densities Grown by Isoelectronic Doping of Hyride VPE Grown InP," Journal of Crystal Growth, vol. 96, 1989, pp. 982-984.
Bhattacharya, P. K. et al., "Defect Densities in Molecular Beam Epitaxial GaAs Achieved by Isoelectronic Doping," Applied Physics Letters, vol. 49, 8/25/86, pp. 470-472.
Ehrenreich et al., "Mechanism for Dislocation Density Reduction in GaAs Crystals by Indium Addition," Applied Physics Letters, vol. 46, Apr. 1, 1985, pp. 668-670.

Primary Examiner—William Mintel

[57] ABSTRACT

A direct band gap semiconductor compound, GaAs$_{1-x}$P$_x$, where x is less than 0.45, is doped with nitrogen for forming an array of light emitting diodes. Preferably, the light emitting junctions of the LEDs are substantially free of nitrogen, but the underlying epitaxially grown semiconductor compound is nitrogen doped. The nitrogen doping is believed to immobilize dislocations for enhancing uniformity of light output power, reducing degradation and increasing uniformity of degradation during use of the LEDs. The proportion of LED arrays rejected for nonuniformity was reduced from 40 percent to less than 8 percent by nitrogen doping the direct band gap material.

15 Claims, 2 Drawing Sheets

Fig. 1
Fig. 2
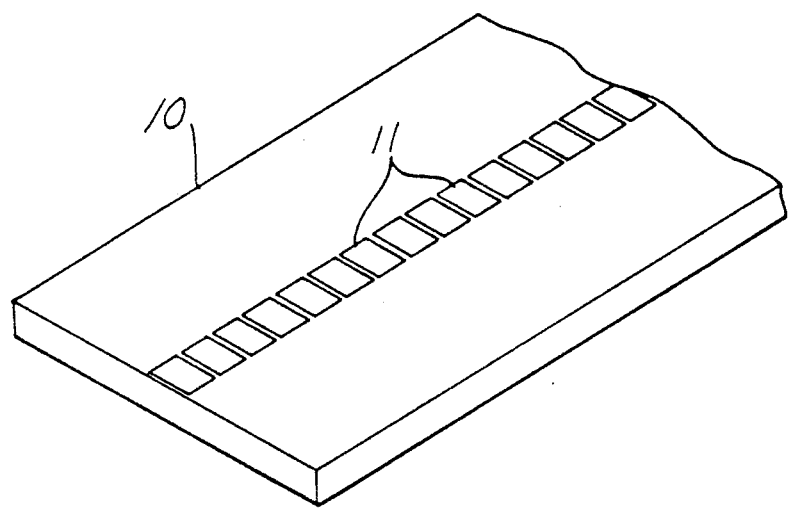
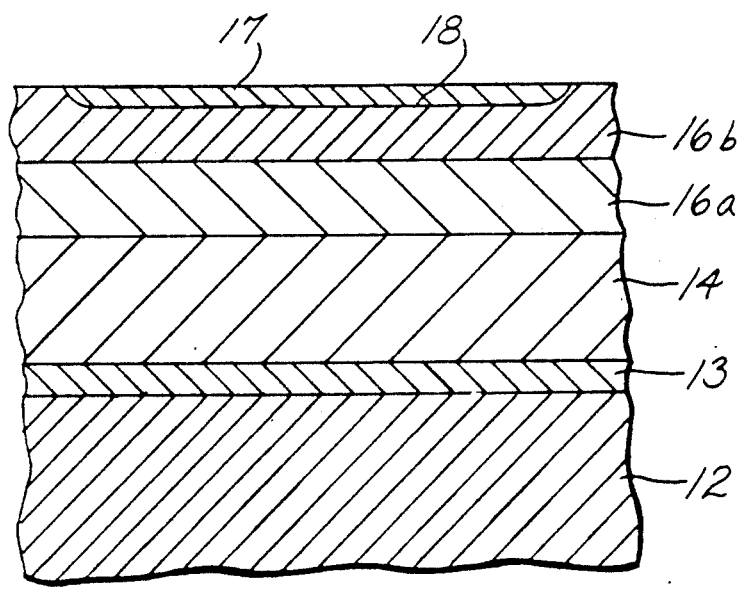

LIGHT EMITTING DIODES WITH NITROGEN DOPING

BACKGROUND

This invention relates to doping of direct band gap $GaAs_{1-x}P_x$ semiconductor light emitting diodes with nitrogen for improving uniformity of optical power output and reducing degradation.

It has become desirable to employ electrographic or other photosensitive printers for text and graphics. In an electrographic printer, an electrostatic charge is formed on a photoreceptive surface of a moving drum or belt and selected areas of the surface are discharged by exposure to light. A printing toner is applied to the drum and adheres to the areas having an electrostatic charge and does not adhere to the discharged areas. A toner is then transferred to a sheet of plain paper and is heat fused to the paper. By controlling the areas illuminated and the areas not illuminated, characters, lines and other images may be produced on the paper.

One type of nonimpact printer employs an array of light emitting diodes (LEDs) for exposing the photoreceptive surface. A row, or two closely spaced rows, of minute LEDs are positioned near an elongated lens array so that their images are arrayed across the surface to be illuminated. As the surface moves past the line of LEDs, they are selectively activated to either emit light or not, thereby exposing or not exposing the photoreceptive surface in a pattern corresponding to the LEDs activated.

To form good images in an LED printer, it is desirable that all of the LEDs produce controlled light output power when activated. This assures a uniform quality image all the way across a paper for black-and-white printing and control of exposure for gray-scale printing. Typically, in gray-scale printing where the light output as a function of current is known, the ON-time of the LED is controlled to obtain a desired exposure of the electrographic surface.

Light emitting diodes for printheads are formed on wafers of GaAsP or the like suitably doped to conduct current and emit light at a diode junction. Long arrays of LEDs are formed on a wafer which is cut into separate chips, each having an array of LEDs. A row of such chips are assembled end-to-end on the printhead. It is desirable that the efficiency of the LEDs on a chip be reasonably uniform and that the efficiency degrade only a small and uniform amount as the LEDs are used. This is desirable for maintaining uniformi.y of illumination and good efficiency over the lifetime of the printer.

The amount of time that each LED has been on and its temperature are two factors which affect the amount of light output from each LED. It is believed that the degradation of light output power efficiency is related to the number of defects or dislocations at the junctions in the crystalline lattice structure of the doped semiconductor of the LED.

Light emitting diodes are made from both direct and indirect type semiconductors. In a direct type semi-conductor, the minimum in the conduction band is at the same crystal momentum as the maximum in the valence band. Thus, when an electron makes a transition from the valence band to the conduction band, there is no requirement for a change in crystal momentum. In an indirect semiconductor, on the other hand, the minimum in the conduction band is at a different crystal momentum from the maximum in the valence band. The electron transition requires a change in crystal momentum as well as the band gap energy. Thus, the probability of radiative recombination is reduced. Radiative recombination occurs readily in direct band gap semiconductor LEDs. On the other hand, in indirect band gap semiconductors, the probability of radiative recombination is rather low and the crystals are, therefore, doped to provide recombination centers for enhancing the radiative transitions.

In the gallium arsenic phosphorus compound system, $GaAs_{1-x}P_x$, when x is greater than 0.45, the semiconductor has an indirect band gap. Nitrogen is used to replace some of the phosphorus atoms in the crystal lattice. The outer electronic structure of nitrogen is similar to that of phosphorus, but the inner electronic structure is very different. This produces an isoelectronic recombination center close to the minimum of the conduction band and greatly enhances the probability of radiative recombination in this indirect band gap semiconductor.

Nitrogen doping has been avoided in direct band gap $GaAs_{1-x}P_x$ since there is no need for additional recombination centers, and the quantum efficiency and light output power from the LED are reduced.

It remains desirable to minimize degradation in light output efficiency in a direct band gap semiconductor. It is proposed that pinning of dislocations and defects may make a more perfect crystal in an epitaxial layer of an LED and may also minimize migration or extension of dislocations to the light emitting junction, thereby enhancing light output efficiency and minimizing degradation.

BRIEF SUMMARY OF THE INVENTION

Thus, in practice of this invention according to a presently preferred embodiment, nitrogen is introduced into the crystal structure of a direct band gap semiconductor, $GaAs_{1-x}P_x$, where x is less than 0.45. A light emitting diode array having a plurality of light emitting junctions in an epitaxially grown layer doped with nitrogen has an improved yield because of enhanced uniformity of the LED junctions and also shows smaller and more consistent efficiency degradation. Preferably, the epitaxial layer immediately adjacent to the light emitting junction is substantially free of nitrogen for maintaining high light output efficiency.

A typical LED has a gallium arsenide substrate. A graded layer is epitaxially grown on the substrate, gradually changing composition from GaAs to $GaAs_{1-x}P_x$. Above the graded layer, there is a constant composition layer of $GaAs_{1-x}P_x$ where x is less than 0.45. At least a portion of the epitaxial layer is doped with nitrogen, for example, in the range of from $10^{16}$ to $10^{18}$ atoms/cm$^3$. An array of diffused junctions is formed in the surface of the constant composition epitaxial layer for emitting light. Preferably, the nitrogen doping is discontinued a few microns from the junctions.

DRAWINGS

These and other features and advantages of the present invention will be appreciated as the same becomes better understood by reference to the following detailed description when considered in connection with the accompanying drawings, wherein:

FIG. 1 illustrates semi-schematically a fragment of a light emitting diode chip having a plurality of LEDs;

FIG. 2 is a fragmentary schematic cross section of an LED;

DETAILED DESCRIPTION

Figure 3:
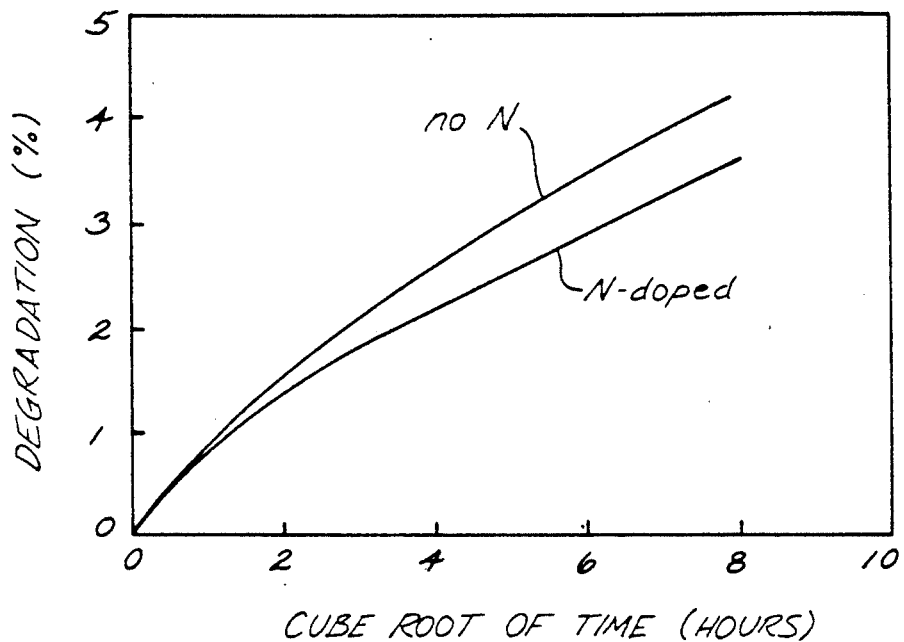
FIG. 3 is a graph of degradation as a function of time for doped and nondoped direct band semiconductors.

An exemplary light emitting diode (LED) array for a printhead comprises a chip 10 having a row of light emitting junctions 11 along its length. To give an order of magnitude, such a chip may be about eight millimeters long and about a millimeter wide. Depending on the resolution of the printhead, individual LED junctions may be about 30 to 70 microns wide and in the order of 100 microns long. There may be about 100 to 200 such LED junctions on a chip.

One of the criteria for an acceptable chip is the uniformity of light output power as a function of current, i.e. the efficiency of the LEDs. The ratio of the most efficient to the least efficient LED on a chip should be small enough that the power supply for the LEDs can provide adequate compensation and uniform total light output power from each of the LEDs on the chip. In other words, the smaller the ratio, the better. If the ratio is too high, a chip may be rejected for a particular application.

An exemplary chip has an n-type gallium arsenide substrate 12. A thin buffer layer 13 of gallium arsenide is epitaxially grown by a conventional vapor phase epitaxy (VPE) technique. The buffer layer is typically in the order of two to seven microns thick and provides a better crystalline surface on which to epitaxially grow the overlying layers than does the bulk gallium arsenide of the substrate. A graded layer 14 is then epitaxially grown on the buffer layer to a total thickness in the order of 20 to 50 microns. The graded layer has a gradually changing composition from GaAs to $GaAs_{1-x}P_x$. The gradually changing composition is employed to minimize lattice strain due to crystal dimension mismatch.

When the top of the graded layer reaches the desired $GaAs_{1-x}P_x$ composition, a further constant composition layer 16 is epitaxially grown to a total thickness of from 10 to 30 microns, usually from 20 to 30 microns. In an exemplary LED, the epitaxially grown layers are doped with tellurium to be n-type.

Following epitaxial growth, a thin layer 17 of p-type material is formed by diffusing a suitable dopant, such as zinc, from the surface. When the chip is complete, this layer may be from one to three microns thick. The junction 18 between the p-type and n-type materials at the bottom of the diffusion layer is the light emitting junction of the LED. Such vapor phase epitaxial growth and formation of diffused junctions is all quite conventional. In addition, conventional insulating coatings, electrical contacts and the like (not shown) are made on the chip for completing the LEDs.

In practice of this invention, a small amount of ammonia is included in the gallium, arsenic and phosphorus compound vapors employed in the VPE process. This results in codeposition of monatomic nitrogen, which replaces a small amount of the phosphorus in the crystal lattice. As previously mentioned, codeposition of nitrogen for nitrogen doping indirect band gap semiconductors is conventional. It is not conventional for direct band gap semiconductors. Nitrogen doping tends to decrease light output efficiency.

In practice of this invention, ammonia is included in the VPE process, even though the LED being made is a direct band gap semiconductor, $GaAs_{1-x}P_x$, where x is less than 0.45. Nitrogen doping is included in at least the graded layer 14 and lower portion 16a of the constant composition layer. It may also be included in the gallium arsenide buffer layer and upper portion 16b of the constant composition layer. The magnitude of the nitrogen doping is preferably in the range of $10^{16}$ to $10^{18}$ atoms/cm$^3$. Somewhat higher or lower proportions may also be used.

Nitrogen doping of the entire epitaxial layer, including doping of the light emitting junction, resulted in a significantly enhanced uniformity of optical power output of LED arrays. For example, in one series of tests 920 electrically acceptable LED chips were tested for light output power and 368 were rejected on the basis that the ratio of power output from LEDs on the chip exceeded the applicable specification. Thus, is exactly 40 percent of the chips were ratio rejects. Similar tests were made on 1,453 chips doped with nitrogen. In this group, only 291 of the chips were ratio rejects. Thus, the rejection rate dropped from 40 percent to 20 percent.

Furthermore, there was a significant reduction in optical power output degradation during LED operation, and what may be of even greater significance, there was a much greater uniformity in the amount of degradation.

Light output power as a function of current was checked in 88 chips with no nitrogen and 88 chips doped with nitrogen after 72 hours of operation with a peak current of 100 milliamps and a 9.1 percent duty cycle (i.e. ON 9.1% of the time and OFF 91.9% of the time).

The average degradation of the chips with no nitrogen was 5.8 percent. Average degradation of the nitrogen-doped chips was decreased to 4.3 percent. The standard deviation of degradation with no nitrogen was 2.5 percent, with chips ranging all the way from 1 percent to 17 percent degradation. The standard deviation for the nitrogen-doped chips decreased to only 0.8 percent, with all of the chips showing degradation in the range of from 2 to 8 percent.

Preferably, the doping with nitrogen is only in the lower portion 16a of the constant composition layer. The ammonia in the VPE process is discontinued so that there is a few microns separation, preferably at least five microns, between the last of the nitrogen doped semiconductor and the light emitting junction. Thus, the junction itself is substantially free of nitrogen. Surprisingly, the incorporation of nitrogen in the direct band gap GaAsP epitaxial layer at a location away from the junction maintains the significantly enhanced optical power uniformity without sacrificing power efficiency. Thus, the ratio rejects decreased from about 20 percent down to less than 8 percent. The amount of degradation during operation of the LEDs is also reduced.

Generally speaking, increased nitrogen doping concentration increases the yield of LED chips, that is, the reject ratio is decreased. Furthermore, the closer the nitrogen doping is to the light emitting junction, the better the improvement in yield. It is found, however, that light output power efficiency is decreased somewhat as the nitrogen doping approaches closely to the junction. The reason for this is not known. It may be that nitrogen is diffusing to the junction during later processing of the chip, or that residual nitrogen bearing gas remains in the VPE reaction chamber after flow is discontinued.

FIG. 3 is a graph of degradation in percent plotted against the cube root of operating time in hours (that is, full scale on this graph would be 1,000 hours). The upper curve shows the degradation of $GaAs_{0.7}P_{0.3}$ compound LEDs with no nitrogen doping. The lower curve shows the degradation of LEDs made from the same compound doped with nitrogen through only a portion of the constant composition layer so that the light emitting junction itself is substantially free of nitrogen. In this test, degradation decreased from about 4.3 percent at 512 hours for the nitrogen-free chips to about 3.6 percent for the nitrogen-doped chips.

Figure 4:
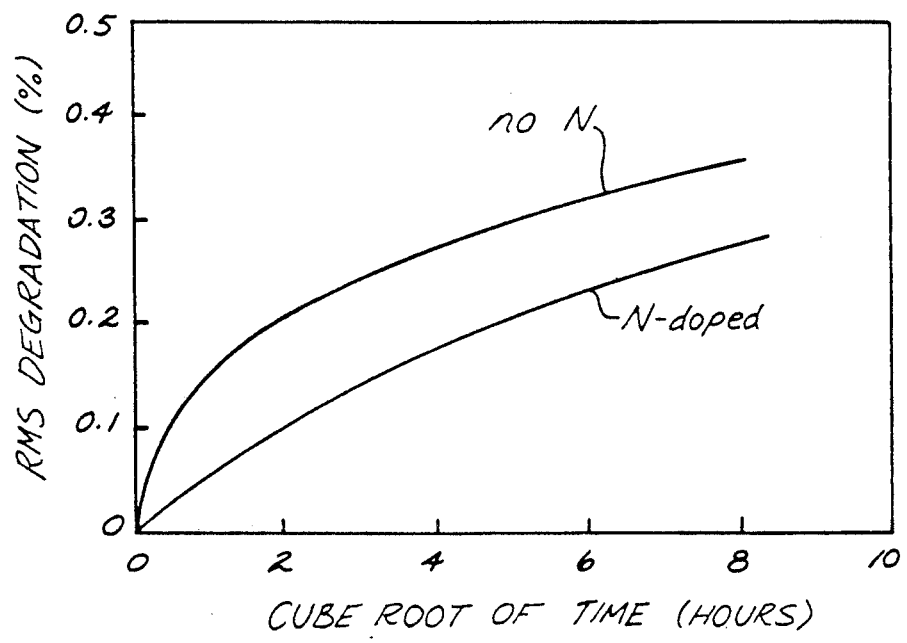
FIG. 4 is a graph illustrating uniformity of degradation in doped and nondoped LEDs.

FIG. 4 illustrates RMS degradation in percent for the same LEDs plotted against the cube root of time in hours. The RMS degradation was reduced by nitrogen doping from about 0.4 percent to about 0.3 percent when tested after 512 hours operation.

It is believed that the significant improvement of LED properties found by nitrogen doping in the direct band gap $GaAs_{1-x}P_x$ compound is due to immobilizing point or line defects in the epitaxially grown crystal. This belief derives from the following papers: P. A. Kirkby, "Dislocation Pinning in GaAs by the Deliberate Introduction of Impurities," *IEEE Journal of Quantum Electronics*, Vol. QE-11, No. 7, July 1975, pp. 562-8. R. Westphalen, et al., "Epilayers with Extremely Low Dislocation Densities Grown by Isoelectronic Doping of Hyride VPE Grown InP", *Journal of Crystal Growth*, Vol. 96, 1989, pp 982-4. Pallab K. Bhattacharya, et al., "Defect densities in molecular beam epitaxial GaAs achieved by isoelectronic doping", *Applied Physics Letters*, Vol. 49 Aug. 25, 1986, pp. 470-2. H. Ehrenreich, et. al., "Mechanism for dislocation density reduction in GaAs crystals by indium addition", *Applied Physics Letters*, Vol. 46, Apr. 1, 1985, pp. 668-70.

This effect occurs during the VPE process and produces a lower dislocation density at the light emitting junction than occurs in the absence of nitrogen doping. Furthermore, it is believed that the nitrogen doping tends to pin dislocations and keep them from extending or migrating to the light emitting junction during operation of the LEDs. By having a more perfect crystal at the light emitting junction, there is greater uniformity in light output power and the ratio rejection rate can be quite significantly reduced. Furthermore, with fewer dislocations inherent in the crystals, the degradation and uniformity of degradation are also improved.

It will be apparent to those skilled in the art that many modifications and variations in this invention may be made. Thus, for example, although the technique has been described in the context of an LED array with a plurality of diffused junctions, a similar technique may be used for an individual LED with an epitaxially grown unction. It will also be recognized that the dimensions and reference to n- and p-type materials are merely exemplary. It is, therefore, to be understood that within the scope of the appended claims the invention may be practiced otherwise than as specifically described.

What is claimed is:
1. A light emitting diode comprising:
   a substrate;
   a layer of epitaxially grown direct band gap $GaAs_{(1-x)}P_x$ of one conductivity type above the substrate, wherein x is less than 0.45; and
   a doped layer of the opposite conductivity type forming a light emitting junction in the epitaxially grown layer; and wherein
   at least a portion of the epitaxial layer of direct band gap material is doped with nitrogen.

2. A light emitting diode as recited in claim 1 wherein the doped layer is a layer containing dopant diffused from the surface of the light emitting diode.

3. A light emitting diode as recited in claim 2 wherein the layer containing dopant diffused from the surface is substantially free to nitrogen doping.

4. A light emitting diode as recited in claim 3 wherein a portion of the epitaxial layer below the light emitting junction is substantially free of nitrogen doping.

5. A light emitting diode as recited in claim 1 wherein the epitaxial layer adjacent to the light emitting junction is substantially free of nitrogen doping.

6. A light emitting diode as recited in claim 1 wherein the nitrogen doping is in the range of from $10^{16}$ to $10^{18}$ atoms/cm$^3$.

7. A light emitting diode array comprising:
   a substrate;
   a layer of epitaxially grown direct band gap $GaAs_{(1-x)}P_x$ of one conductivity type above the substrate, wherein x is less than 0.45, at least a portion of the epitaxial layer being doped with nitrogen; and
   a plurality of doped layers of the opposite conductivity type diffused from the surface of the epitaxial layer and forming an array of light emitting junctions in at least a portion of the direct band gap epitaxial layer.

8. A light emitting diode array as recited in claim 7 wherein the light emitting junctions are substantially free of nitrogen doping.

9. A light emitting diode array as recited in claim 7 wherein the nitrogen doping is in the range of from $10^{16}$ to $10^{18}$ atoms/cm$^3$.

10. A light emitting diode array comprising:
    a substrate;
    a layer of epitaxially grown direct band gap $GaAs_{(1-x)}P_x$ of one conductivity type above the substrate, wherein x is less than 0.45;
    a plurality of doped layers of the opposite conductivity type diffused from the surface of the epitaxial layer and forming an array of light emitting junctions in an upper portion of the epitaxial layer; and
    nitrogen doping in a lower portion of the direct band gap epitaxial layer remote from the light emitting junctions.

11. A light emitting diode array as recited in claim 10 wherein the light emitting junctions are substantially free of nitrogen doping.

12. A light emitting diode array as recited in claim 11 wherein the nitrogen doping is in the range of from $10^6$ to $10^{18}$ atoms/cm$^3$.

13. In a light emitting diode array comprising:
    a gallium arsenide substrate;
    an epitaxially grown constant composition direct band gap $GaAs_{1-x}P_x$ compound layer of one conductivity type, wherein x is less than 0.45;
    an epitaxially grown graded composition layer between the substrate and the constant composition layer having a gradually changing composition from gallium arsenide to $GaAs_{(1-x)}P_x$; and a plurality of light emitting junctions adjacent a layer of the opposite conductivity type diffused into the constant composition layer remote from the substrate; the improvement comprising nitrogen doping in at least a portion of the graded layer and the direct band gap constant composition layer.

14. A light emitting diode array as recited in claim 13 wherein a portion of the constant composition layer remote from the light emitting junction is doped with nitrogen and the light emitting junction is substantially free of nitrogen.

15. A light emitting diode array as recited in claim 13 wherein the nitrogen is in the range of from $10^{16}$ to $10^{18}$ atoms/cm$^3$.

* * * * *